US012319995B2

(12) United States Patent
Nishida et al.

(10) Patent No.: US 12,319,995 B2
(45) Date of Patent: Jun. 3, 2025

(54) VAPOR DEPOSITION APPARATUS, VAPOR DEPOSITION METHOD, AND METHOD FOR MANUFACTURING ORGANIC EL DISPLAY APPARATUS

(71) Applicant: HON HAI PRECISION INDUSTRY CO., LTD., New Taipei (TW)

(72) Inventors: Koshi Nishida, Osaka (JP); Kozo Yano, Osaka (JP); Katsuhiko Kishimoto, Osaka (JP); Susumu Sakio, Osaka (JP)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 561 days.

(21) Appl. No.: 17/709,864

(22) Filed: Mar. 31, 2022

(65) Prior Publication Data

US 2022/0220600 A1 Jul. 14, 2022

Related U.S. Application Data

(62) Division of application No. 16/087,094, filed as application No. PCT/JP2016/071623 on Jul. 22, 2016, now Pat. No. 11,319,624.

(30) Foreign Application Priority Data

Mar. 23, 2016 (JP) ................................. 2016-058695

(51) Int. Cl.
*C23C 14/04* (2006.01)
*C23C 14/12* (2006.01)
(Continued)

(52) U.S. Cl.
CPC ............ *C23C 14/042* (2013.01); *C23C 14/12* (2013.01); *H10K 71/166* (2023.02)

(58) Field of Classification Search
None
See application file for complete search history.

(56) References Cited

U.S. PATENT DOCUMENTS 4,565,158 A * 1/1986 Koprio .................. C23C 14/243
118/733
7,019,268 B2 * 3/2006 Paxton ................ G03F 7/70525
219/448.11
(Continued)

FOREIGN PATENT DOCUMENTS

JP 2005206939 A 8/2005
JP 2005281746 A 10/2005
(Continued)

OTHER PUBLICATIONS

Machine Generated English Translation of JP2005-281746 held to Ikehara Tadayashi published Oct. 13, 2005. (Year: 2005).*
(Continued)

*Primary Examiner* — Sylvia Macarthur
(74) *Attorney, Agent, or Firm* — ScienBiziP, P.C.

(57) ABSTRACT

A vapor deposition method and a vapor deposition apparatus that, when a vapor deposition material is deposited on a substrate, make it possible to form deposition layer pattern precisely so that the deposition layer pattern is formed uniformly without a gap formed between a deposition mask and the substrate. A deposition mask is disposed with its periphery held by a frame. A substrate on which a vapor deposition layer is to be formed is mounted over the deposition mask. A vapor deposition source is disposed facing the deposition mask and evaporates a vapor deposition material. The vapor deposition is performed while the substrate is pressed vertically at a position of a center of deflection of the deposition mask and on an upper surface of the substrate until that a length of the substrate substantially becomes
(Continued)

identical to a length of the deposition mask being bowed down and expanded.

8 Claims, 7 Drawing Sheets

(51) Int. Cl.
*H01L 51/00* (2006.01)
*H10K 71/16* (2023.01)

(56) References Cited

U.S. PATENT DOCUMENTS

| | | | | |
|---|---|---|---|---|
| 7,115,186 | B2* | 10/2006 | Miyamoto | B01B 1/005 261/95 |
| 7,393,207 | B2* | 7/2008 | Imai | H01L 21/67109 211/41.18 |
| 8,082,877 | B2* | 12/2011 | Frob | C23C 14/12 118/723 VE |
| 9,543,186 | B2* | 1/2017 | Cuvalci | H01L 21/6875 |
| 2005/0153472 | A1 | 7/2005 | Yotsuya et al. | |
| 2006/0130765 | A1* | 6/2006 | Hoffmann | F16K 1/14 118/726 |
| 2007/0184195 | A1 | 8/2007 | Kaisha | |
| 2009/0124033 | A1 | 5/2009 | Kaisha | |
| 2009/0286447 | A1 | 11/2009 | Kobayashi | |
| 2010/0024733 | A1 | 2/2010 | Kaisha | |
| 2010/0031888 | A1* | 2/2010 | Priddy | C23C 14/243 439/82 |
| 2022/0220600 | A1* | 7/2022 | Nishida | C23C 14/12 |

FOREIGN PATENT DOCUMENTS

| | | |
|---|---|---|
| JP | 2008059757 A | 3/2008 |
| JP | 2009277655 A | 11/2009 |
| JP | 2010031345 A | 2/2010 |
| JP | 2010180438 A | 8/2010 |
| JP | 2012052155 A | 3/2012 |
| TW | 200525708 A | 8/2005 |
| WO | 2017163440 A1 | 9/2017 |

OTHER PUBLICATIONS

Machine Generated English Translation of JP2012-052155 held to Yoshikawa et al. published Mar. 15. 2012. (Year: 2012).*

* cited by examiner

VAPOR DEPOSITION APPARATUS, VAPOR DEPOSITION METHOD, AND METHOD FOR MANUFACTURING ORGANIC EL DISPLAY APPARATUS

CROSS-REFERENCE TO RELATED APPLICATIONS

This application is a divisional application of U.S. Ser. No. 16/087,094, filed Sep. 21, 2018 the contents of which are hereby incorporated by reference.

TECHNICAL FIELD

The present invention relates to a vapor deposition apparatus, a vapor deposition method, for example, which are used to deposit organic layers of the organic EL display apparatus, and a method for manufacturing an organic electro-luminescence (EL) display apparatus. More specifically, the present invention relates to a vapor deposition apparatus and a vapor deposition method that make it possible to reduce unsharpness and non-uniformity of vapor deposition patterns by performing vapor deposition while the substrate for vapor deposition is in contact with a deposition mask, and also relates to a method for manufacturing an organic EL display device with this vapor deposition method.

BACKGROUND ART

Contemporary display apparatus such as organic EL display apparatus need to employ high definition design, and deposition masks used therefor have fine opening portions. As a deposition mask, a resin film that can be processed precisely or a complex mask which includes a resin film and a metal support layer trends to be used. Due to enlargement of screen of organic EL display apparatus or boost their production in which a plurality of panels are deposited at one time, that is multiple-panel masks, the deposition mask trends to be enlarged. As a result, some deposition masks have a size of as large as one meter or more per side.

Figure 6:
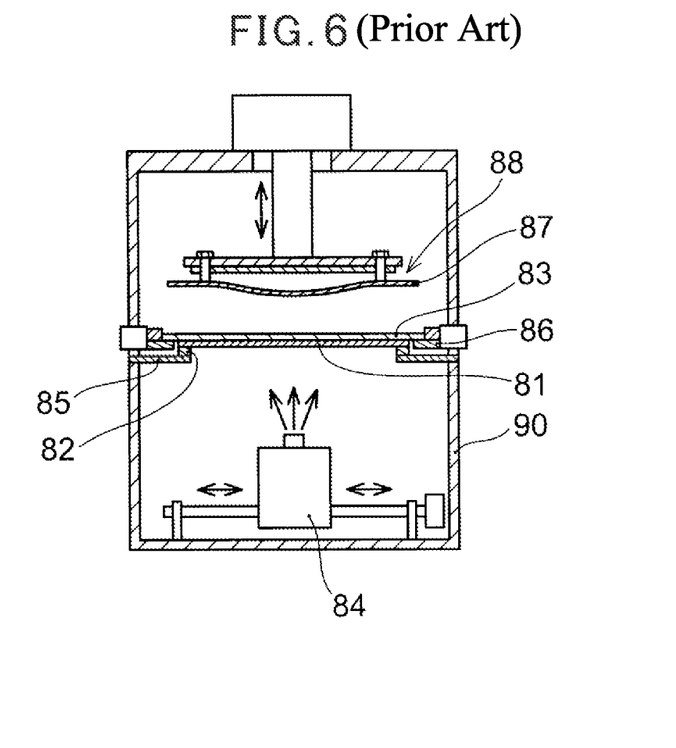
FIG. 6 is a diagram illustrating an example of a conventional process in which the substrate for vapor deposition is brought into contact with a deposition mask when a vapor deposition material is vapor-deposited on a substrate for vapor deposition.

When an organic EL display apparatus is manufactured, for example, a mask 81 and a substrate 83 are placed inside a chamber 90 as illustrated in FIG. 6. Further, the mask 81 is mounted on a mask support base 85, and the substrate 83 is mounted on the mask 81. When from a vapor deposition source 84 disposed under the mask 81 a vapor deposition material evaporates, this vapor deposition material passes through openings of the mask 81 and is deposited on the substrate 83. In this way, a deposition layer of organic layers is formed on the substrate 83 (e.g., see Patent Document 1). In FIG. 6, the reference numeral 82 denotes a frame used to fix a periphery of the mask 81, and the reference numeral 86 denotes a substrate support base used to hold the substrate 83.

As the substrate 83 and the mask 81 become larger in size, the mask 81 is more prone to being bowed down downward at its center during the vapor deposition process, which leads to a formation of defective pattern layers on the substrate 83. Patent Document 1 describes provision of a substrate-mask contact unit 88. In this description, a flexible plate 87 of the substrate-mask contact unit 88 applies pressure to an entire bowed surface of the substrate 83 toward the mask 81, thereby bringing the substrate 83 into contact with the mask 81.

Figure 7:
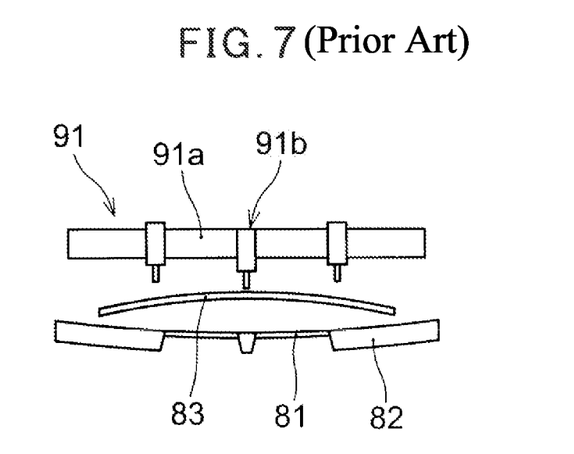
FIG. 7 is a diagram illustrating another example of a conventional process in which the substrate for vapor deposition is brought into contact with the deposition mask.

Patent Document 2 discloses provision of a substrate pressing unit 91. The substrate pressing unit 91 applies loads on the back surface of the substrate 83 at a plurality of points in accordance with an amount of the deflection of the substrate 83, thereby improving the contact between the substrate 83 and the mask 81. This enables a vapor deposition pattern to be formed precisely on the substrate 83 even when the substrate 83 and the mask 81 are enlarged. More specifically, in this description, as illustrated in FIG. 7, the pressing unit 91 formed by screwing a plurality of plungers 91b into through-holes in the plunger holder 91a applies the loads on the substrate 83 at the plurality of points, thereby bringing the substrate 83 into contact with the mask 81.

PRIOR ART DOCUMENT

Patent Document

Patent Document 1: JP 2009-277655 A
Patent Document 2: JP 2005-281746 A

SUMMARY OF THE INVENTION

Problem to be Solved by the Invention

The above flexible plate described in Patent Document 1 is not deemed to be high in rigidity. Therefore, Patent Document 1 may lack an intention to deform the substrate for vapor deposition into a certain shape by applying the loads on the substrate for vapor deposition via the flexible plate that conforms to the shape of the substrate for vapor deposition. Furthermore, it may be difficult to effectively apply the loads on the substrate for vapor deposition by applying the loads on the flexible plate supported at specific points. Moreover, the deformed shape of the substrate for vapor deposition, namely, the deformed shape of the flexible plate may be unpredictable. Also, a method for bringing the substrate for vapor deposition into contact with the deposition mask may be unclear. Moreover, it may be unclear how to apply loads on the flexible plate in order to bring the substrate for vapor deposition into contact with the deposition mask, especially when the substrate for vapor deposition is made of glass. In short, Patent Document 1 fails to disclose or suggest a method for bringing the substrate for vapor deposition into contact with the deposition mask. More specifically, it neither discloses nor suggests what kind of object is used to press the substrate for vapor deposition, what shape this object has, and how strong the object needs to press the substrate for vapor deposition.

In Patent Document 2, the plurality of plungers apply the loads on the substrate for vapor deposition at the plurality of points. However, the points at which the loads are applied on the substrate for vapor deposition may be unclear. Further, it may also be unclear how many and where the points are and how heavy each load is. When the loads are applied on the plurality of points, the deflection of the substrate for vapor deposition can depend on the relative positional relationship of the plungers.

An object of the present invention, which has been made in the view of the above situations, is to provide a vapor deposition method and a vapor deposition apparatus that, when a vapor deposition material is deposited on a substrate for vapor deposition, make it possible to form a deposition pattern precisely so that the deposition pattern is not formed non-uniformly due to a gap formed between a deposition mask and the substrate for vapor deposition.

Another object of the present invention is to provide a method for manufacturing an organic EL display apparatus of a high display quality by using the above vapor deposition method.

Means to Solve the Problem

With increasing definition of organic EL and other display apparatuses, as described above, a resin film tend to increasingly used in a deposition mask, and a substrate for vapor depositions and the deposition masks have been increasingly enlarged. On the other hand, a problem that the deposition mask is bowed downward at a center is becoming more prominent. In some cases, a magnetic chuck method is employed. In this magnetic chuck method, a complex deposition mask in which a metal support layer made of a magnetic material is laminated on a resin film is used, and a magnet is provided on an opposite side of a substrate for vapor deposition to the deposition mask and attracts the deposition mask. To form a fine pattern, however, a thinner metal support layer needs to be used in order to prevent a shadow from being caused during vapor deposition. In this case, a magnetic attractive force generated by the magnet, which is proportional to a volume of its magnetic material, is weakened. Even if a magnet that can generate a strong magnetic field is used, the deposition mask may be deformed or wrinkled, because the deposition mask has a small thickness and thus low rigidity. If the magnet generates an excessively strong, attractive force, the deposition mask may damage the vapor-deposited surface of the substrate for vapor deposition, which can be a problem. Therefore, the method for attracting the deposition mask strongly with a magnetic force may be improper to the solution.

The method for applying pressure to a substrate for vapor deposition via a flexible plate or other sheet object, as described in Patent Document 1, or the method for applying loads on the substrate for vapor deposition at a plurality of points via plungers, as described in Patent Document 2, may have difficulty bringing the substrate for vapor deposition into contact with the deposition mask, because points at which loads are applied effectively on the substrate for vapor deposition are unclear, as described above. If a gap is created between the substrate for vapor deposition and the deposition mask, a pattern of openings in the deposition mask may not be transferred correctly to the substrate for vapor deposition. As an example, an area of the substrate for vapor deposition on which the vapor deposition material is deposited to form a pattern of openings may be larger than the pattern of openings in the deposition mask. As another example, the boundary between openings in the vapor deposition material may be unsharped. As a result, patterns each made of a deposition layer of organic layers are not formed uniformly on the substrate for vapor depositions. If such deposition layer is used for pixels of a display apparatus, this display apparatus may exhibit a low display quality, which can be a problem.

The present inventor et al. have diligently studied a method for suppressing unsharpness or non-uniformity of deposited patterns by performing vapor deposition while a deposition mask and a substrate for vapor deposition are in substantial contact with each other with little gap therebetween. As a result of this study, it was found that it is possible to perform vapor deposition while a substrate for vapor deposition and a deposition mask are in substantial contact with each other throughout the vapor deposition, by mounting the substrate for vapor deposition on an upper surface of the deposition mask and by pressing down vertically the substrate for vapor deposition at a position of the center of deflection (where the deposition mask is displaced maximally from its flat state) of the deposition mask and at an upper surface (surface on an opposite side to the deposition mask) of the substrate for vapor deposition until the substrate for vapor deposition and the deposition mask are bowed down to substantially the same degree. In this case, if the substrate for vapor deposition is a substrate having high rigidity such as a thick glass plate, when the substrate for vapor deposition is pressed locally at its center, it is easily curved to make contact with the deposition mask. However, if the substrate for vapor deposition is a thin glass plate or a flexible substrate, it may not be curved from the center of the deflection toward the fulcrum on the periphery. In this case, it is preferred that a pressing tool used to press the substrate for vapor deposition is formed such that at least a portion to be contact with the substrate for vapor deposition is formed into an arched shape whose radius of curvature is identical to that of the center of the substrate for vapor deposition being pressed. By this way, the substantially entire surfaces of the substrate for vapor deposition and the deposition mask can be brought into contact with each other. This is because the bowed surface of the deposition mask can be regarded as a substantially spherical surface.

The amount of deflection of the deposition mask is preferably the sum of a deflection length of the deposition mask arched at a fulcrum on its periphery and an amount of the expansion of the deposition mask caused by temperature rise during the vapor deposition. That is, on the basis of the length of the bowed deposition mask which includes its thermal expansion, an amount in which the substrate for vapor deposition is pressed and a radius of curvature of a spherical surface of the pressing tool that makes contact with the substrate for vapor deposition are determined. The above pressed amount and the radius of curvature are determined in the following manner. First, a cross section of the deposition mask which is taken along a line that is parallel to its one side and that passes through the center of the deflection of the deposition mask is obtained. Then, the curved line of the cross section obtained is regarded as an isosceles triangle, a peak of which corresponds to the center of the deflection and a base of which corresponds to a line segment between fulcra at both ends of the deposition mask. By using the length of the base of the isosceles triangle and the length (maximum amount of deflection) of a vertical line extending from the peak to the base, the entire length of the bowed deposition mask can be approximately expressed as the total length of the two equal sides of the isosceles triangle. More specifically, the bowed deposition mask is defined as two right triangles, which are obtained by equally dividing the above isosceles triangle along a vertical line passing through the center of the deflection of the deposition mask. Using a half ($L_0/2$) of a base length $L_0$ (a length of the deposition mask when it is not bowed down) and the maximum amount of deflection $d_0$, the length $[(L_0/2)^2+d_0^2]^{1/2}$ of the hypotenuse of one of the right triangles is calculated. The entire length of the bowed deposition mask is approximately expressed as twice the length of the hypotenuse of this right triangle. Details of this will be described later.

Figure 4A:
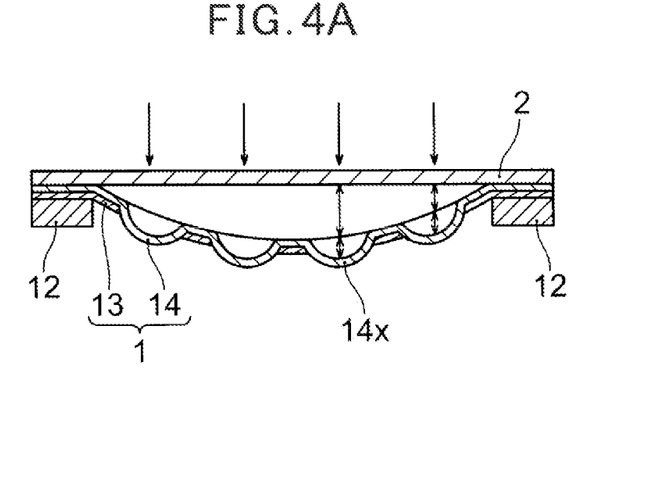
FIG. 4A is an explanatory diagram illustrating another embodiment of a method for bringing the substrate for vapor deposition into contact with the deposition mask, in the case of FIG. 3A.

As a result of another diligent study, the present inventor et al. have found that, if a plurality of active regions in each of which a pattern of opening portions is to be formed are present on the deposition mask, the entire deposition mask is bowed down at the fulcrum on its periphery, and moreover, the active regions are individually bowed down (see the exaggerated diagram in FIG. 4A). In addition, it has been found that it is necessary to expand the deposition mask by further pressing the substrate for vapor deposition, in consideration of the deflection of the individual active regions. In this case, the deflection of a number (n portions) of active regions may be considered at one time by pressing the deposition mask at its center. Alternatively, loads may be applied on the respective active regions at their centers; the load on each active region is determined by the sum of its amount of deflection and the amount of deflection of the entire deposition mask at its position. Details of this will be described later too.

A vapor deposition method of the present invention comprising: disposing a deposition mask in a horizontal position with holding its periphery; mounting a substrate for vapor deposition over an upper surface of the deposition mask so as to be overlaid on the deposition mask, a vapor deposition layer to be formed on the substrate for vapor deposition; disposing a vapor deposition source so as to face the deposition mask; and forming the vapor deposition layer on the substrate for vapor deposition by deposing a vapor deposition material in the vapor deposition source; wherein the substrate for vapor deposition is pressed vertically at a position of a center of deflection of the deposition mask and that is on an upper surface of the substrate for vapor deposition, by an amount equating to or exceeding a depth of the deflection of the deposition mask relative to a fulcrum on the periphery of the deposition mask, and a vapor depositing is performed while the substrate for vapor deposition is in contact with the deposition mask.

A vapor deposition apparatus of the present invention comprising: a mask holder on which a deposition mask is mounted; a substrate holder provided so as to be able to hold a substrate for vapor deposition; a touch plate provided above the substrate for vapor deposition held by the substrate holder, the touch plate being in contact with the substrate for vapor deposition; a vapor deposition source that evaporates or sublimates a vapor deposition material, the vapor deposition source being provided on an opposite side of the deposition mask to the substrate holder, the deposition mask being mounted on the mask holder; and a pressing device that presses an upper surface of the substrate for vapor deposition, wherein the pressing device is provided so as to be able to press vertically the substrate for vapor deposition at a center position of deflection of the deposition mask on the upper surface of the substrate for vapor deposition held by the substrate holder.

A method, of the present invention, for manufacturing an organic EL display apparatus by depositing organic layers on a device substrate comprising: forming the device substrate by forming at least a TFT and a first electrode on a support substrate; forming a deposition layer of the organic layers on the device substrate by depositing organic materials over the first electrode with the above vapor deposition method; and forming a second electrode on the deposition layer.

Effects of the Invention

According to the vapor deposition method of the present invention, the upper surface of the substrate for vapor deposition is pressed along a central line of the deflection of the deposition mask. In this case, the pressed point can be positioned at the maximum deflection point. Thus, the pressed force is concentrated on the substrate for vapor deposition, thereby easily pressing the substrate for vapor deposition by a predetermined amount. As a result, the substrate for vapor deposition can easily be pressed by the predetermined amount even if the substrate for vapor deposition is a glass plate. When the substrate for vapor deposition made of glass is pressed at a single point, it is not depressed locally at this point but curved smoothly across the whole body, because glass has high rigidness. In other words, when the substrate for vapor deposition is pressed only at its center, it is depressed into an incurved shape with the center being its peak. As a result, the pressed force effectively acts on the substrate for vapor deposition and provides the incurved surface similar to the deflection of the deposition mask, thereby improving the contact between the substrate for vapor deposition and the deposition mask. If the substrate for vapor deposition is a thin glass plate, a flexible substrate made of a resin film, or other substrate having low rigidness, a surface of the pressing tool which abuts against the substrate for vapor deposition needs to be formed into a curved shape whose radius of curvature is identical to that of the deposition mask in a bowed state. In this case, a force mainly acts on the center of the deflection of the substrate for vapor deposition, but also acts on its surround area so that it is deformed in conformity with the shape of the pressing tool. It should be noted that a bar of the pressing tool pressing against the substrate for vapor deposition has preferably an end with a curved surface rather than a sharp or flat end, even if the substrate for vapor deposition is a glass plate having high rigidness. The curved surface of the end is preferably similar to that of the deflection of the deposition mask.

According to the vapor deposition apparatus of the present invention, the pressing device is provided so as to be able to press vertically the substrate for vapor deposition at the position of the center of the deflection of the deposition mask and on the upper surface of the substrate for vapor deposition held by the substrate holder. Therefore, the pressing device can easily press the substrate for vapor deposition by a predetermined amount. As an example, in the pressing device, an actuator may press a plunger (preferably has an end with a curved surface as described above) by the predetermined amount. As another example, a pressing tool that is formed of a member having a predetermined size of curved surface such as a sphere or the like, or that has a wide, spherical surface that abuts against the substrate for vapor deposition may be disposed at a predetermined position between the touch plate and the substrate for vapor deposition held by the substrate holder. And, the actuator may press down the touch plate vertically against this pressing tool. This configuration can easily press down the substrate for vapor deposition by the predetermined amount.

According to the method for manufacturing the organic EL display apparatus of the present invention, it is possible to provide very sharp pixels without forming unsharped deposition layers of organic layers having a non-uniform size. Consequently, it is possible to provide an organic EL display apparatus of a high display quality.

EMBODIMENT FOR CARRYING OUT THE INVENTION

With reference to the accompanying drawings, a description will be given of an embodiment of a vapor deposition method and a vapor deposition apparatus of the present invention. In the vapor deposition method of the present invention, a deposition mask 1 is disposed in a horizontal position with its periphery held by a frame 12. Mounted on the upper surface (in a vertical direction) of the deposition mask 1 is a substrate 2 for vapor deposition on which a vapor deposition layer is to be formed. The deposition mask 1 and the substrate 2 for vapor deposition are overlaid on each other. Disposed under the deposition mask 1 is a vapor deposition source 5 that vaporizes a vapor deposition material 51 to form the vapor deposition layer on the substrate 2 for vapor deposition. This embodiment is characterized in that: the substrate 2 for vapor deposition is pressed vertically at a position of a center of deflection of the deposition mask 1 and on an upper surface of the substrate 2 for vapor deposition by an amount equating to or exceeding a depth of the deflection of the deposition mask 1 relative to a fulcrum on its periphery; and then vapor deposition is performed while the substrate 2 for vapor deposition and the deposition mask 1 are in contact with each other.

More specifically, the substrate 2 for vapor deposition is pressed until a length of an arc between a point on a side of the deposition mask 1 at which the substrate 2 for vapor deposition is in contact with the fulcrum and a point on the surface on a side of the deposition mask 1 at which the substrate 2 for vapor deposition intersects a vertical line to the center of the deflection becomes substantially identical to a length of an arc between the fulcrum (point B in FIG. 2A) on the periphery of the deposition mask 1 and a center (point A in FIG. 2A) of the deflection of the deposition mask 1. In other words, the substrate 2 for vapor deposition is pressed until surfaces of the deposition mask 1 and the substrate 2 for vapor deposition which are in contact with each other have substantially the same radius of curvature. The "pressed by an amount equating to or exceeding the depth of the deflection of the deposition mask 1" needs to be done in order to compensate for the following deflection of the deposition mask 1: the deflection of the deposition mask 1 at the fulcrum on the periphery; deflection of each active region 14 (see FIGS. 3A and 3B) that will be described later; and deflection of the deposition mask caused by thermal expansion during the vapor deposition. The expression "compensate for the thermal expansion" means that the deposition mask 1 has been expanded in advance by an amount corresponding to the thermal expansion, and thus the size of the deposition mask 1 remains unchanged from the state of being expanded in advance even when the deposition mask 1 is thermally expanded. In the case of this embodiment, the thermal expansion is compensated for, because the deposition mask 1 is expanded by being pressed. There are cases where an actual pressed amount is about twice or more to ten times or less, more preferably, about third times or more to seven times or less the amount of deflection relative to the fulcrum on the periphery. In short, the substrate 2 for vapor deposition is preferably pressed by an amount exceeding the depth of the deflection relative to the fulcrum on the periphery. Furthermore, pressing the substrate 2 for vapor deposition by an amount exceeding the total amount of deflection of the deposition mask 1 or more is also effective in bringing the substrate 2 for vapor deposition into contact with the deposition mask 1. It should be noted that the arrow line above the substrate 2 for vapor deposition in FIG. 3B denotes a position at which a load is applied on the substrate 2 for vapor deposition in order to press the substrate 2 for vapor deposition.

Figure 1A:
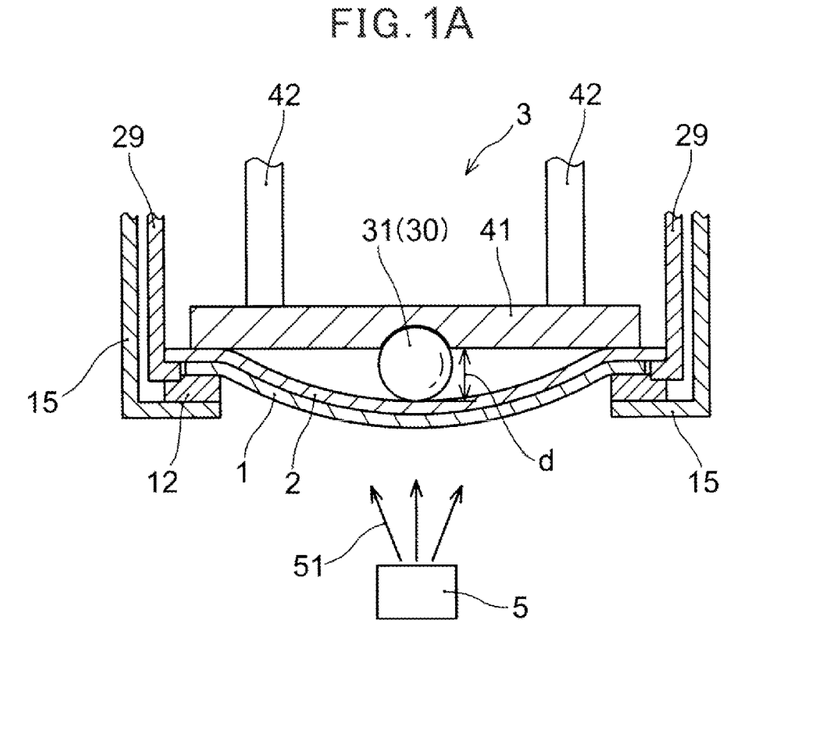
FIG. 1A is a schematic diagram illustrating an embodiment of a vapor deposition apparatus of the present invention.
Figure 1B:
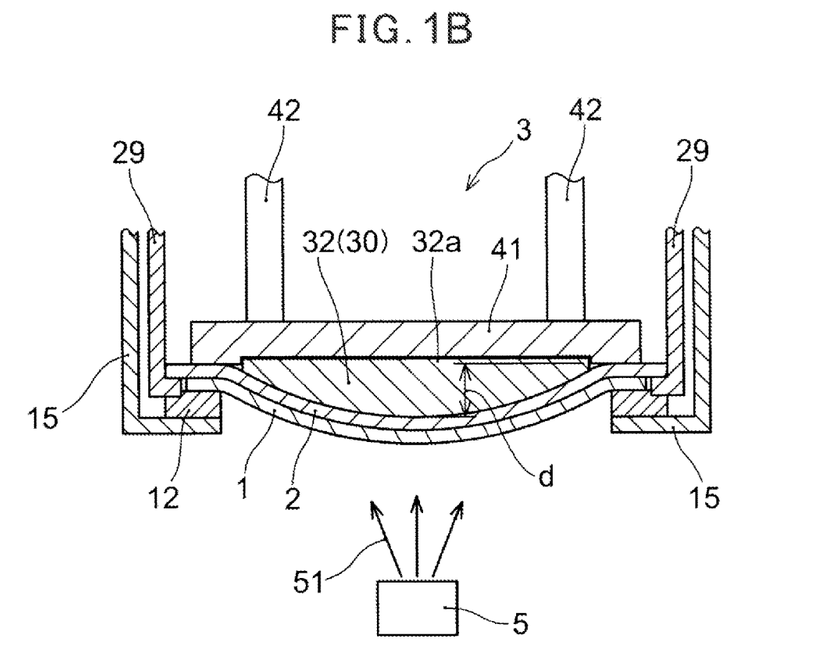
FIG. 1B is a schematic diagram illustrating a modification of the pressing tool in the vapor deposition apparatus in FIG. 1A.
Figure 4B:
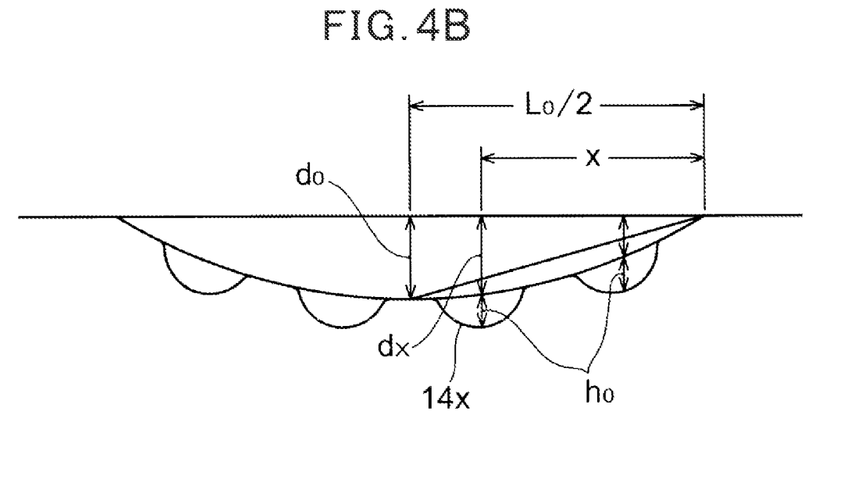
FIG. 4B is a schematic diagram illustrating an example of a method for calculating a pressed amount in FIG. 4A.
Figure 4C:
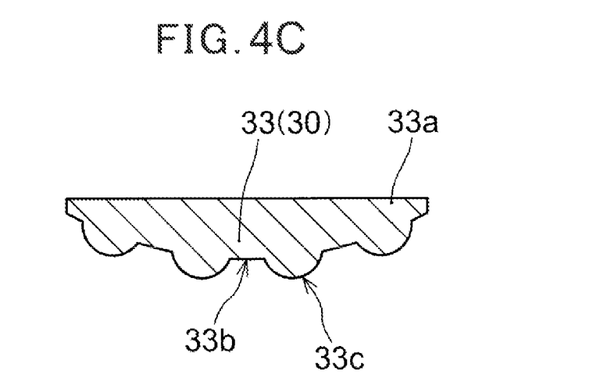
FIG. 4C is a diagram illustrating an example of a shape of a wide pressing tool for use in bringing the substrate for vapor deposition into contact with the deposition mask, in the case of FIG. 4A.

FIG. 1A illustrates an example in which a pressing device 3 presses a pressing tool 30, which is a sphere 31 such as a steel ball or a plastic ball having high rigidity, against the substrate 2 for vapor deposition by using a touch plate 41 and an unillustrated pressing member including an actuator. However, the pressing device 3 is not limited to this example. Alternatively, the pressing device 3 may press a plunger by a certain amount by using the actuator or other similar member. In this case, it is preferable that the plunger have a curved shape at its end. It is more preferable that the end of the plunger have a spherical surface whose radius of curvature is identical to that of a curved surface of the deposition mask 1. The pressing tool 30 does not necessarily have to be the sphere 31 and may have any other shape accordingly. As illustrated in FIG. 1B, for example, the pressing tool 30 may be a spherical cap 32 formed by partly cutting off a sphere. In other words, a surface of the pressing tool 30 which abuts against the substrate 2 for vapor deposition is formed into a spherical shape whose radius of curvature is identical to that of the curved surface of the deposition mask 1. If the pressing tool 30 has a shape as described above, it mainly presses the center of the deflection. However, the pressing force also acts on its surrounding area, thereby making it possible to press the substrate 2 for vapor deposition while forming the surface of the substrate 2 for vapor deposition into a spherical shape. In this case, the substrate 2 for vapor deposition is pressed in a manner similar to the way in which it is pressed locally. The force acting on the area around the center is auxiliary. Even when the force that would press the center is simply distributed across this area, its total amount is not changed. As illustrated in FIG. 4C, the pressing tool 30 may be a spherical cap 33 with projection, in which some projections are formed on a spherical cap. A width of the spherical surface (a length of a portion of the spherical cap which engages with the touch plate 41 in FIG. 1B) is not specifically limited, and the length may have any width within an inside size of the frame.

To allow the pressing tool 30 to engage with the touch plate 41, a base section 32a is formed in the spherical cap 32 as illustrated in FIG. 1B, or a base section 33a is formed in the spherical cap 33 as illustrated in FIG. 4C. However, the base sections 32a and 33a may be optional. Alternatively, the spherical cap 32 with no base section 32a or the spherical cap 33 with no base section 33a may be bonded to the touch plate 41. The spherical cap 32 with no base section 32a or the spherical cap 33 with no base section 33a may be integrated with the touch plate 41 or any other member. The spherical surface of the portion of the pressing tool 30 which abuts against the substrate 2 for vapor deposition has a radius of curvature which is identical to that of the curved surface of the deflection of the deposition mask 1, more specifically, that of a portion of the deposition mask 1 corresponding to the depth of the deflection. Details of this will be described later. In short, the characteristic is as follows: the upper surface of the substrate 2 for vapor deposition is pressed along the vertical line at the center of the deflection; the pressed amount is pressed until the length of the substrate 2 for vapor deposition becomes substantially identical to that of the deposition mask 1 in a bowed state; and the spherical surface of the end portion of the pressing tool 30 which abuts against the substrate 2 for vapor deposition preferably has a radius of curvature identical to that determined from the curved surface of the deposition mask 1 in the bowed state.

Figure 2A:
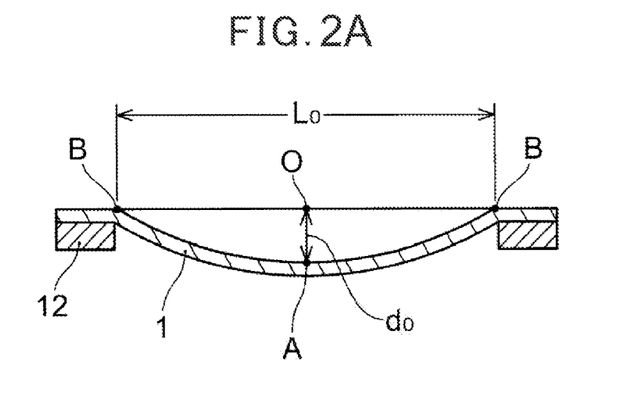
FIG. 2A is an explanatory diagram illustrating deflection of the deposition mask in FIGS. 1A and 1B.
Figure 2B:
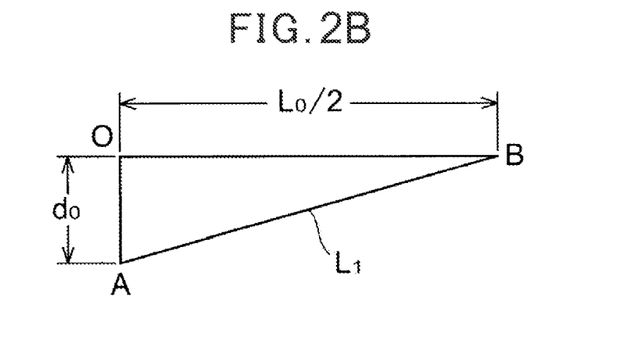
FIG. 2B is an explanatory diagram illustrating a method for determining a length of the deposition mask in FIGS. 1A and 1B when it is bowed down.

Here, as each of the lengths of the deposition mask 1 and the substrate 2 for vapor deposition, one directional length of a cross section taken along a line that is parallel to a side of the deposition mask 1 and that passes through the center of the deflection of the deposition mask 1 is considered. The cross section of each of the deposition mask 1 and the substrate 2 for vapor deposition has a curved surface when they are bowed down. As illustrated in FIGS. 2A and 2B, the length of each curved surface can be approximately expressed as the sum of the lengths of the two equal sides of an isosceles triangle (only its half is illustrated in FIG. 2B) created by connecting the points A and B: the point A is a point at which the deposition mask 1 is maximally bowed down; and the point B is a point (fulcrum) at which the deposition mask 1 is not bowed down. Considering the half of the isosceles triangle, or a right triangle OAB, a length AB ($L_1$ in FIG. 2B) of the hypotenuse can be determined from a half (OB in FIG. 2A) of a design length $L_0$ in a non-bowed state and a maximum value OA ($d_0$) of the deflection. A radius r of curvature of the deposition mask 1 in a bowed state is determined by calculating a length r of a line segment FA. This is because, as illustrated FIG. 2C, if a cross section of the deflection is regarded as having an arc shape, an intersection F between a bisector (center is a point G) of a line segment AB and an extended line passing through deflection OA is a central point of a curved line.

The downward amount $d_0$ (see FIG. 2A) of the deflection of the deposition mask 1 (a distance by which the central portion of the deposition mask 1 is bowed downward) relative to the fulcrum on the periphery can be measured in an optical manner. When the deposition mask 1 is bowed down, the length of the deposition mask 1 is approximately expressed as $2L_1$ (see FIG. 2B). In this case, $$L_1 = [d_0^2 + (L_0/2)^2]^{1/2} \quad (1).$$

If the deposition mask 1 is simply bowed down at the fulcrum on the periphery, as illustrated in FIG. 2A, the substrate 2 for vapor deposition is pressed by an amount corresponding to the amount of deflection $d_0$ of the deposition mask 1. In this way, the length of the deposition mask 1 being bowed down becomes substantially identical to that of the substrate 2 for vapor deposition being pressed. It should be noted that FIG. 1A illustrates the deflection in an exaggerated manner, and an actual amount of deflection $d_0$ is about 100 μm when the deposition mask has a size of 700 mm×450 mm, for example.

Figure 2C:
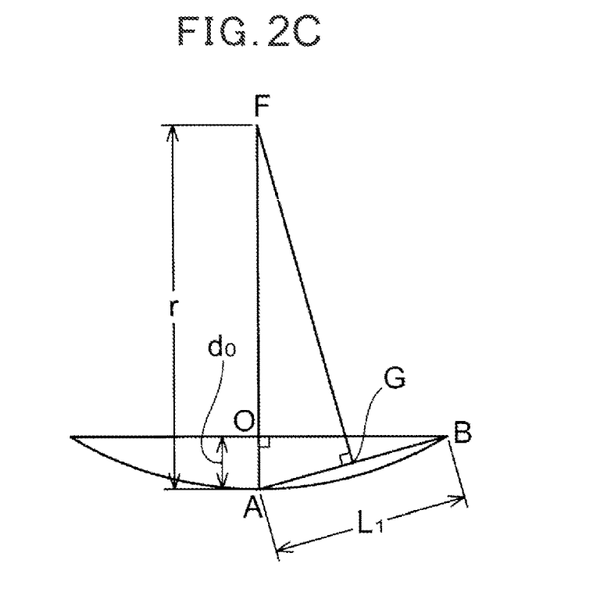
FIG. 2C is an explanatory diagram illustrating a method for determining a radius of curvature of the deposition mask in FIG. 2A when it is bowed down.
Figure 3A:
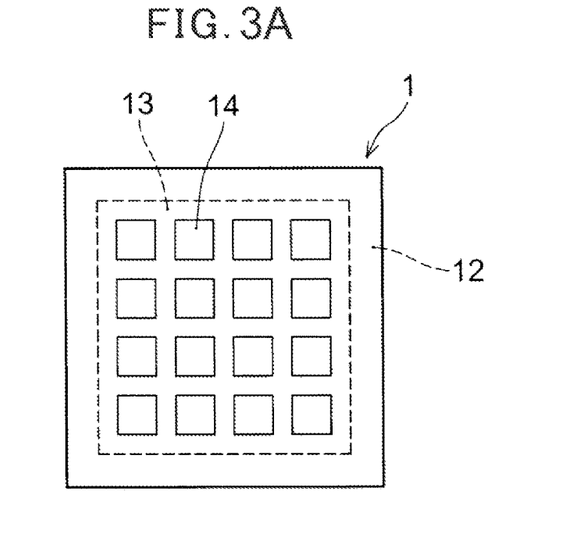
FIG. 3A is an explanatory plan diagram illustrating the deposition mask when a plurality of regions (active regions) each in which openings are formed are present in the deposition mask (explanatory plan diagram from which a substrate for vapor deposition in FIG. 3B is removed).
Figure 3B:
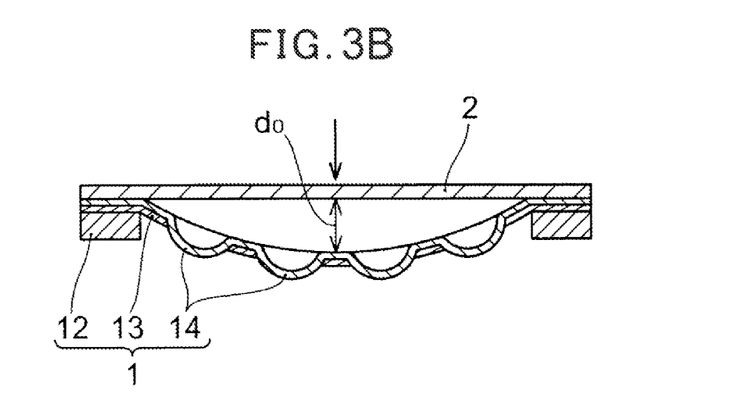
FIG. 3B is an explanatory diagram illustrating deflection in active regions in FIG. 3A.

Referring to FIG. 2C, the midpoint of the line segment AB is denoted by a central point of the spherical shape is denoted by F when the bowed shape is regarded as a spherical shape, and FA=r, AB=$L_1$, and OA=$d_0$ because ΔAGF is analogous to ΔAOB. In this case, the radius r of curvature at the center of the deflection is expressed as:

$$r/(L_1/2) = L_1/d_0$$

$$r = L_1^2/(2d_0) \quad (2),$$

where $L_1$ is determined by equation (1). However, if the thermal expansion of the deposition mask 1 and the active regions 14 (see FIG. 3A) that will be described later are considered, the values $L_1$ and $d_0$ are changed. In general, the depth of deflection becomes a length d. Therefore, when the amount of deflection illustrated in FIG. 1B is d as described later, Li is also changed as described later. However, the surface of the pressing tool 30 which abuts against the substrate 2 for vapor deposition is preferably a spherical surface having the radius r of curvature which is determined by d and $L_1$.

During the vapor deposition, the vapor deposition source 5 vaporizes the vapor deposition material, which then is deposited on the substrate 2 for vapor deposition, as described above. In this case, the vapor deposition source 5 has high temperature, and thus the temperature of the deposition mask 1 rises. In proportion to this temperature rise, the amount of deflection of the deposition mask 1 increases. Since the deposition mask 1 is bowed down only during the vapor deposition, the amount of deflection caused due to the thermal expansion is difficult to directly measure. However, if a linear expansion coefficient and temperature rise of the deposition mask 1 is denoted by α and t, respectively, for example, an amount of the thermal expansion of the deposition mask 1 is expressed as $\alpha t L_1$. As described above, a half-length of the bowed deposition mask 1 disposed in the horizontal position is expressed by $L_1$. Thus, a half-length $L_2$ of the deposition mask 1 which reflects its thermal expansion is expressed as:

$$L_2 = L_1 + \alpha t L_1 = [d_0^2 + (L_0/2)^2]^{1/2} + \alpha t L_1 \quad (3).$$

In this case, an amount of deflection $d_2$ of the deposition mask 1 is expressed as:

$$d_2=[L_1+\alpha t L_1)^2-(L_0/2)^2]^{1/2}.$$

This means that the pressing device 3 presses the substrate 2 for vapor deposition by the amount of deflection $d_2$, thereby making it possible to compensate for the thermal expansion of the deposition mask 1 in the future. In this case, when the pressing device 3 presses the substrate 2 for vapor deposition by the amount of deflection $d_2$ before the temperature rises, the deposition mask 1 is pressed and deformed (expanded). As a result, the deposition mask 1 is deformed by this amount of deflection $d_2$. Thereafter, when the deposition mask 1 is expanded due to the temperature rise, its thermal expansion cancels the deformation of the deposition mask 1. In short, when the thermal expansion of the deposition mask 1 matches the pressed amount $d_2$ for the substrate 2 for vapor deposition, the substrate 2 for vapor deposition makes contact with the deposition mask 1. When the temperature rises by about 1° C. during the vapor deposition, the deposition mask 1 is expanded by only less than 1 μm due to its coefficient of thermal expansion. However, when the temperature rise is significant, the effect of the amount of deflection $d_2$ becomes prominent. When the pressed amount $d_2$ matches the thermal expansion of the deposition mask 1, the substrate 2 for vapor deposition makes contact with the deposition mask 1.

In the above example, the deposition mask 1 has an even and uniform overall body. However, for example, the deposition mask 1 may be a multiple-panel mask for use in performing, at one time, vapor deposition on a plurality of relatively small panels such as smartphones or other electric devices. In this case, as in an example illustrated in the plan view of FIG. 3A, the deposition mask 1 includes: active regions 14 formed within openings in a metal film 13; and fine opening portions that are formed in the active regions 14 and correspond to vapor deposition patterns. Each active region 14 may be formed of a resin film on its overall surface or may be used with a complex mask that includes a resin film and a metal support layer. In any case, since the opening portions are formed in the active regions 14, the active regions 14 have lower rigidness than the portion of the metal film 13 and are bowed down more easily than that portion. Consequently, as can be seen from FIG. 3B that exaggeratedly illustrates a cross section of the deposition mask 1 which is taken so as to pass through a center of the deflection of the deposition mask 1 and parallel to its one side, the present inventors have found that not only the deflection $d_0$ of the entire deposition mask 1 (at the fulcrum of the periphery) but also deflection $h_0$ (see FIG. 3C) of each active region 14 is present. Furthermore, the present inventors have found that it is difficult to bring the substrate 2 for vapor deposition into contact with the deposition mask 1 unless the substrate 2 for vapor deposition is expanded in accordance with a varying length of the deposition mask 1 which is caused by the deflection $h_0$ of each active region 14.

Figure 3C:
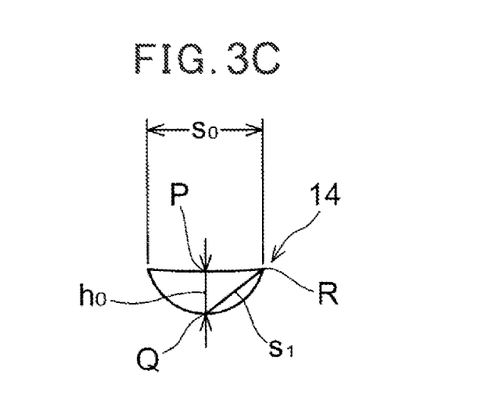
FIG. 3C is an explanatory diagram illustrating a method for approximately determining a length of each active region in FIG. 3B.

Next, a description will be given of a method for reducing an influence of the deflection of the active regions 14. FIG. 3C schematically illustrates a cross section of an active region 14 taken along a line that is parallel to one side of the deposition mask 1 and that passes through the center of deflection of the active region 14. In this example, similar to the above, a half-length $s_1$ of the active region 14 in a bowed state can be approximately expressed by the length of the hypotenuse of a right triangle PQR. The deflection $h_0$ of the active region 14 can be known through actual measurement. When a length of the above cross section of the active region 14 is denoted by $s_0$, the half-length $s_1$ of the active region 14 in the bowed state is expressed as:

$$s_1=[h_0^2+(s_0/2)^2]^{1/2}$$

In this case, a variation $\Delta s$ in the length of the active region 14 is expressed as:

$$\Delta s=2(s_1-s_0/2)=2[h_0^2+(s_0/2)^2]^{1/2}-s_0 \qquad (4).$$

To cancel the variation in the length of the active region 14, two methods for pressing the substrate for vapor deposition are conceivable.

Figure 3D:
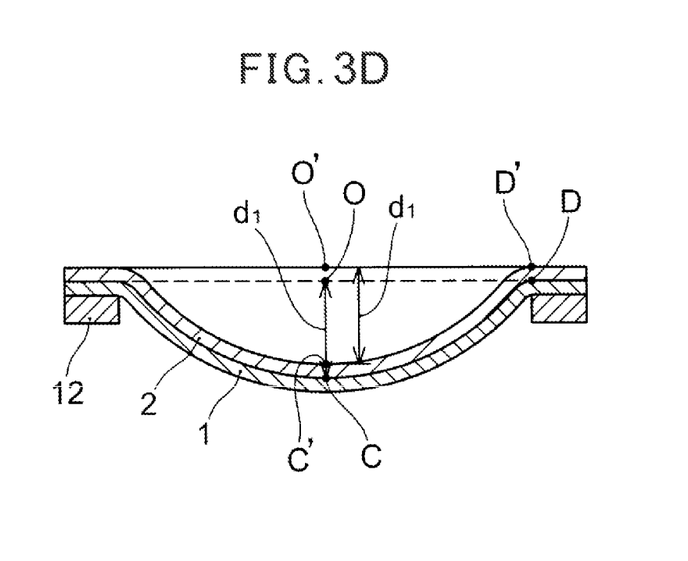
FIG. 3D is an explanatory diagram illustrating an embodiment of a method for bringing the substrate for vapor deposition into contact with the deposition mask, in the case of FIG. 3A.
Figure 3E:
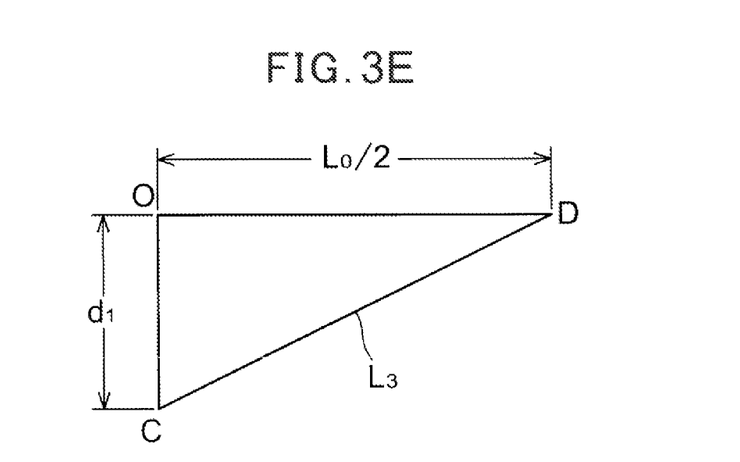
FIG. 3E is an explanatory diagram illustrating an example of a method for calculating a pressed amount in FIG. 3D.

In the first method, as illustrated in FIG. 3D, the deposition mask 1 is expanded until its curved surface becomes smooth. Then, the substrate 2 for vapor deposition is pressed at its center until it has the same curved surface. In this way, the entire surfaces of the substrate 2 for vapor deposition and the deposition mask 1 make contact with each other. In this method, a length $L_3$ of the hypotenuse of an approximate right triangle OCD illustrated in FIG. 3E, namely, a length of the deposition mask 1 which reflects the variation $\Delta s$ in the length of the active regions 14 is determined. A pressed amount $d_1$ for the substrate 2 for vapor deposition thereby can be obtained. In FIGS. 3D and 3E, the length $L_3$ of the arc which reflects the deflection of the deposition mask 1 is approximately expressed by the length of the hypotenuse of the triangle OCD. The pressed shape of the substrate 2 for vapor deposition can also be approximately expressed by a triangle O' C' D', because the pressed shape of the substrate 2 for vapor deposition also substantially coincides with that of the deposition mask 1. For this reason, the pressed amount $d_1$ for the substrate 2 for vapor deposition is identical to a depth $d_1$ (length of the line OC) of the deposition mask 1 bowed down at the fulcrum on the periphery, the depth $d_1$ reflecting the deflection of the active regions 14.

The length $L_3$ of the deposition mask 1 is identical to a length to which the variations $\Delta s$ in the lengths of the active regions 14 due to the deflection are added. Accordingly, the length $L_3$ is obtained by summing the variations $\Delta s$ in the lengths of active regions 14 by a number of times that is equal to the number of active regions 14 along the cross section. Here, an n number of active regions 14 are expected to be present along the cross section. When a half portion of the deposition mask 1, as illustrated in FIG. 3E, is considered, the number of active regions 14 is n/2. Since a variation in the length of the deposition mask 1 per active region 14 is $\Delta s$ as described above, the length $L_3$ of the hypotenuse in FIG. 3E is expressed as:

$$L_3=L_1+(n/2)\Delta s \qquad (5).$$

In this case, the length $L_1$ can be determined from equation (1). From FIG. 3E, thus, the pressed amount $d_1$ for the substrate 2 for vapor deposition is expressed as:

$$d_1=[L_3^2-(L_0/2)^2]^{1/2}.$$

In short, to bring the substrate 2 for vapor deposition into contact with the deposition mask 1, the upper surface of the substrate 2 for vapor deposition needs to be pressed, by an amount corresponding to the length $d_1$, along a vertical line at the center of the deflection of the deposition mask 1 relative to the fulcrum on its periphery. It should be noted that the above explanation does not consider the influence of the thermal expansion. When the thermal expansion is considered, the length $L_2$ determined from equation (3) may be used in equation (5), instead of the length $L_1$.

In the second method, as illustrated in the schematic view of FIG. 4A, the upper surface of the substrate 2 for vapor deposition is pressed along vertical lines at the centers of the deflection of the respective active regions 14, whereby the substrate 2 for vapor deposition is brought into contact with the deposition mask 1 at the active regions 14. One concept in this case is that the substrate 2 for vapor deposition is bowed down in accordance with the deflection of the active regions 14 in the deposition mask 1. Consider a pressed amount $d_3$ for each active region 14 in this case. As can be seen from a proximate right triangle illustrated in FIG. 4B which is similar to the above right triangles, for example, the substrate 2 for vapor deposition needs to be pressed by the pressed amount $d_0$ at the center of the deflection of the deposition mask 1 relative to the fulcrum on the periphery. Therefore, to bring the deposition mask 1 into contact with the substrate 2 for vapor deposition, an active region 14$x$ that is a distance x away from the periphery (edge fixed to the frame 12) needs to be pressed by an amount corresponding to the sum of $x/(L_0/2)$ times the amount of deflection d0 of the entire deposition mask 1 as described in FIG. 4B, that is $2d_0x/L_0$, and the amount of deflection $h_0$ of an active region 14. The pressed amount $d_3(x)$ is expressed as:

$$d_3(x)=2d_0x/L_0+h_0.$$

In the above case, a depth $d_x$ of the deflection of the active region 14$x$ is determined by modifying the depth do of the deflection of the entire deposition mask 1 relative to the fulcrum on the periphery in proportion as the position of the active region 14$x$. Under the condition of all the active regions 14 being bowed down to the same degree, the deflection of each active region 14 is denoted by $h_0$. If the substrate 2 for vapor deposition is made of a material having high rigidity, such as glass, the pressed amount for an active region may be influenced by pressing of a next active region. Therefore, each active region 14 needs to be pressed while an actual pressed amount is measured and adjusted to a target amount. However, if the substrate 2 for vapor deposition is a thin glass plate or flexible substrate that does not have high rigidity or if the active regions 14 are arranged at considerably long intervals, an active region 14 may not be greatly influenced by the pressing of a next active region 14, and thus each active region 14 may be pressed by a preset pressed amount. In FIG. 4A, the arrow lines above the substrate 2 for vapor deposition indicate positions at which loads are applied in order to press the substrate 2 for vapor deposition.

Since the active regions need to be pressed at different forces in the above case, different pressing members, each of which has a plunger, an actuator, and some other parts, preferably press these active regions independently of one another. Each plunger preferably has a round end with a curved surface, as described above. If having a sharp end, each plunger preferably may tear the substrate 2 for vapor deposition especially when the substrate 2 for vapor deposition is a flexible substrate, or each plunger preferably may damage the substrate 2 for vapor deposition when the substrate 2 for vapor deposition is made of glass. In this case, similar to the above example, the end of each plunger preferably has a spherical surface according to a radius of curvature of deflection of a corresponding active region 14. Moreover, the pressing tools 30 (see FIG. 4C) that has an overall spherical surface are preferably used.

When the above pressing tool 30 abuts against the substrate 2 for vapor deposition so as to make contact with its wide area, the spherical cap 33 with projection may be used as an example of the pressing tool 30. As illustrated in FIG. 4C, the spherical cap 33 with projection has a surface of spherical cap 33$b$ and projection parts 33$c$. The surface of spherical cap 33$b$ is formed so as to swell largely at the center of the deflection of the deposition mask 1 relative to the fulcrum on the periphery but to swell less largely at the periphery of the deposition mask 1. Each projection part 33$c$ is formed in relation to the deflection of a corresponding active region 14 at its position. Using the spherical cap 33 with projection can completely bring the substrate 2 for vapor deposition into contact with the deposition mask 1 especially when the substrate 2 for vapor deposition is a flexible substrate. In this case, a radius of curvature of the surface of spherical cap 33$b$ is determined using the radius r defined by equation (2) and the length $L_2$ reflecting the thermal expansion. A radius of curvature of each projection part 33$c$ is calculated from FIG. 3C in a manner similar to the above way in FIG. 2C. Although the projection part 33$c$ is also illustrated in this case, the surface of spherical cap 33$b$ that does not have the projection part 33$c$ may be integrated with or bonded to the touch plate 41 (see FIG. 1B).

As illustrated in FIG. 1A, for example, the vapor deposition apparatus of the present invention includes a mask holder 15, a substrate holder 29, the touch plate 41, the vapor deposition source 5, and the pressing device 3. The mask holder 15 allows the deposition mask 1 to be disposed thereon. The substrate holder 29 is provided so as to be able to hold the substrate 2 for vapor deposition. The touch plate 41 is provided on the substrate 2 for vapor deposition held by the substrate holder 29 while being in contact with the periphery of the substrate 2 for vapor deposition. The vapor deposition source 5 is provided on an opposite side of the substrate holder 29 to the deposition mask 1 mounted on the mask holder 15. The vapor deposition source 5 vaporizes the vapor deposition material. The pressing device 3 presses the upper surface of the substrate 2 for vapor deposition. The pressing device 3 is provided so as to be able to press the upper surface of the substrate 2 for vapor deposition, held by the substrate holder 29, along a vertical line at the center of the deflection of the deposition mask 1 (e.g., the deflection of the entire deposition mask 1 or deflection of the individual active regions 14). In the example illustrated in FIG. 1A, the pressing device 3 presses the pressing tool 30 against the substrate 2 for vapor deposition by using the touch plate 41; however, this example is not limitative. Other examples will be described later.

As described above, the pressing device 3 may be formed so as to press the substrate 2 for vapor deposition by an amount of do or more and $d_2$ or less, or by the amount $d_3(x)$. As illustrated in FIGS. 1A and 1B that have been referenced, the pressing device 3 may include the pressing tool 30 and a pressing member. The pressing tool 30 may a rigid body, for example, made of a metal or plastic having high rigidness; the pressing member may include the touch plate 41 and the actuator. Although not illustrated, various pressing devices, such as a plunger and an actuator, may be used. In short, the pressing device 3 is characterized in that it is formed so as to press the center of deflection of any part by a predetermined amount. It is more preferable that the pressing device 3 is configured to abut against not only the center but also its surrounding area, including the periphery of the substrate 2 for vapor deposition.

FIGS. 1B and 4C illustrate examples of the above configuration. Referring to the example in FIG. 1B, the spherical cap 32 is disposed between the touch plate 41 and the substrate 2 for vapor deposition; the spherical cap 32 conforms to a shape of the deflection of the deposition mask 1 at the fulcrum on the periphery, similar to the structure in FIG. 1A. Aside from the shape of the pressing tool 30, the structure in FIG. 1B is identical to that in FIG. 1A. Therefore, the same reference numerals are given to the identical components and they will not be described. In this example, the spherical cap 32 is formed such that its portion (base section 32a) is embedded in the touch plate 41. However, the spherical cap 32 does not necessarily have to be embedded in the touch plate 41. Alternatively, the spherical cap 32 may be integrated with the touch plate 41. The spherical cap 32 only has projection parts from the touch plate 41 by a predetermined amount d. In this example, the spherical cap 32 needs to press the center of the deflection of the deposition mask by the predetermined amount d.

It is considered that, the substrate 2 for vapor deposition is brought into contact with the deposition mask in accordance with the idea in FIG. 4A. By using the spherical cap 33 with projection as the pressing tool 30, the substrate 2 for vapor deposition can be brought into contact with the deposition mask 1. In the spherical cap 33 with projection, as illustrated in FIG. 4C, the projection parts 33c are formed on the surface of spherical cap 33b. Each projection part 33c has an arc-shaped cross section with a radius of curvature according to the deflection of a corresponding active region 14. The surface of spherical cap 33b has a radius of curvature r (r is a radius defined by equation (2) or a radius in which a length caused by the thermal expansion is added into the radius of equation (2)) in a case where the deflection d0 of the deposition mask 1 occurs at the fulcrum on the periphery. In this case, as described above, the radius of curvature of the spherical surface of the projection parts 33c in each active region 14 is determined from FIG. 3C.

The substrate holder 29 holds the peripheral edge of the substrate 2 for vapor deposition with a plurality of hook-shaped arms and is connected to an unillustrated driving device so as to be capable of ascending and descending vertically. The substrate 2 for vapor deposition carried into the vapor deposition apparatus by robot arms, is received by the hook-shaped arms, and the substrate holder 29 is lowered until the substrate 2 for vapor deposition is in proximity to the deposition mask 1. In addition, an unillustrated image device is provided for performing alignment. The touch plate 41 is supported by a support frame 42. In the example illustrated in FIG. 1A, the support frame 42 lowers until the touch plate 41 makes contact with and presses the periphery of the substrate 2 for vapor deposition with the sphere (pressing tool) 31 therebetween. In this way, the substrate 2 for vapor deposition is brought into contact with the deposition mask 1. An unillustrated pressing member such as an actuator is also provided. The touch plate 41, which is basically provided to make the substrate 2 for vapor deposition flat, may be made of a plate material having high rigidity. Therefore, the touch plate 41 is less likely to be deformed even when pressing the pressing tool 30, that is the sphere 31 such as a steel ball as illustrated in FIG. 1A. The touch plate 41 descends vertically while pressing the pressing tool 30, and makes contact with the periphery of the substrate 2 for vapor deposition, thereby deforming the substrate 2 for vapor deposition.

The sphere 31 has a height corresponding to the distance between the touch plate 41 and the substrate 2 for vapor deposition to the pressed amount d. In the example illustrated in FIG. 1A, the sphere 31 is configured to be partly embedded in the touch plate 41. Further, the sphere 31 is formed such that its diameter is greater than the predetermined length d and it is exposed from the touch plate 41 by the predetermined length d. This structure enables the sphere 31 to move only vertically in relation to the vertical movement of the touch plate 41 without having to move horizontally. As a result, the deflection of the substrate 2 for vapor deposition coincides with that of the deposition mask 1, so that they make contact with each other. However, the configuration of the pressing device 3 is not limited to this. Alternatively, the pressing device 3 may be configured to lower a plunger with an actuator to press the substrate 2 for vapor deposition. In this case, it is preferable that the touch plate 41 has a through-hole and that the plunger pass through this through-hole and press the substrate 2 for vapor deposition. The touch plate 41 has high rigidity as described above. If the substrate 2 for vapor deposition is pressed by the flat surface of the touch plate 41, the pressure is distributed across the substrate 2 for vapor deposition. In which case, it may be difficult to press the center of the deflection of the substrate 2 for vapor deposition. It is necessary to press the center of the deflection of the substrate 2 for vapor deposition.

Unillustrated cooling water may circulate inside the touch plate 41, allowing the touch plate 41 to realize a function of cooling both the substrate 2 for vapor deposition and the deposition mask 1. The pressing tool 30 is not limited the pressing device 3 showed in FIG. 1A. A surface of the touch plate 41 which abuts against the substrate 2 for vapor deposition is formed into a shape the same as that of a surface of the pressing tool 30 which would abut against the substrate 2 for vapor deposition and also formed so as to have a curved surface with the height of the predetermined length d as shown in the above example.

Before the substrate 2 for vapor deposition is pressed, the substrate 2 for vapor deposition and the deposition mask 1 are aligned with each other. During the alignment, the substrate 2 for vapor deposition is moved relative to the deposition mask 1 while alignment marks formed, respectively, on the deposition mask 1 and the substrate 2 for vapor deposition are being imaged. Thus, the vapor deposition apparatus further includes: an unillustrated image device that images the alignment marks; and an unillustrated fine movement device that finely moves the substrate 2 for vapor deposition. Furthermore, all the components in FIG. 1A are placed in an unillustrated chamber, and a vacuum apparatus is provided to make an inside of the chamber vacuum.

As the deposition mask 1 may be used various types of deposition masks, examples of which include: a mask with a resin film alone; a complex mask in which a resin film and a metal support layer are laminated; a multiple-panel mask for use in forming a plurality of panels at one time; and metal masks.

If a resin film is used in the deposition mask 1, the resin film 11 preferably has a linear expansion coefficient similar to that of the substrate 2 for vapor deposition; however, there is no specific limitation on a material of the resin film 11. Examples of the material of the resin film 11 include a polyimide (PI) resin, polyethylene naphthalate (PEN) resin, polyethylene terephthalate (PET) resin, cycloolefin polymer (COP) resin, cyclic olefin copolymer (COC) resin, polycarbonate (PC) resin, polyamide resin, polyamide-imide resin, polyester resin, polyethylene resin, polyvinyl alcohol resin, polypropylene resin, polystyrene resin, polyacrylonitrile resin, ethylene vinylacetate copolymer resin, ethylene-vinyl alcohol copolymer resin, ethylene-methacrylic acid copolymer resin, polyvinyl chloride resin, polyvinylidene chloride resin, cellophane, and ionomer resin. The polyimide resin is especially preferred, because its linear expansion coefficient can be adjusted in accordance with a condition such as a profile of a temperature rise in the heat treatment if the resin film is formed by applying a precursor solution and by subjecting the precursor solution to a heat treatment. However, the material of the resin film 11 is not limited to the polyimide resin. The resin film 11 may have a thickness of approximately several to several tens of micrometers, for example, 5 μm or more, 10 μm or less.

When the metal support layer is formed using a magnetic material, an unillustrated magnet can be provided over the opposite side of the substrate (for vapor deposition) 2 to the deposition mask 1 to magnetically attract and fix the metal support layer. However, this configuration is not limitative. If this metal support layer is provided, openings that are slightly larger in size than that of the opening portions formed in the resin film are formed in the metal support layer. This metal support layer may be formed such that its thickness falls in 5 μm or more and 30 μm or less. If the deposition mask 1 is a multiple-panel mask, the active regions 14 are formed within the deposition mask 1 in relation to panels in the metal layer 13, for example, as illustrated in FIG. 3A. Each active region 14 is formed of a resin film alone. In each active region 14, an opening portion may be formed, or the metal support layer may be formed around this opening portion 3. The metal support layer and the metal layer may be identical material to each other, or the active regions 14 formed independently may be bonded to the opening portions of the metal layer 13. The metal layer 13 preferably has a linear expansion coefficient similar to that of the substrate 2 for vapor deposition. Invar (alloy of Fe and Ni) is especially preferred because it is not greatly thermally expanded.

The deposition mask 1 has been enlarged year by year, and the size of its one side has exceeded one meter. In addition, the resin film, the metal support layer, and the metal layer 13 are all formed of an extremely thin film. Therefore, when the deposition mask 1 is disposed in a horizontal position with its periphery fixed by the frame 12, as illustrated in FIG. 1A, the deposition mask 1 may be bowed down some degree. To prevent this deflection, a tension is applied to a mask material in all directions (so that the mask material is expanded) before mask materials such as the resin film are bonded to the frame, and then the mask material is bonded to the frame 12. Nevertheless, when such extremely thin film is held in a horizontal position while bonded to a large frame body (frame 12) whose size exceeds one meter, they may be bowed down. This deflection is very difficult to prevent. As described above, the present invention subjects the substrate 2 for vapor deposition to conform to the deflection of the deposition mask 1. However, various problems are still present. For example, the deposition mask 1 may be bowed down due to not only its weight but also its thermal expansion. If a multiple-panel deposition mask, as described above, or other similar mask in which both the metal layer 13 and the active region 14 are formed is used, especially its active regions 14 in this mask may be bowed down due to a difference in rigidness between their materials. As a result, the present inventors have found that simply pressing the substrate 2 for vapor deposition by an amount corresponding to the amount of deflection of the deposition mask 1 does not always become a solution. Further, the present inventors have also found that, in the light of various deflection mechanisms of the deposition mask 1, it is possible to bring the substrate 2 for vapor deposition into contact with the deposition mask 1 by pressing the substrate 2 for vapor deposition along a central axis of the deflection of the deposition mask 1.

The frame 12 is usually made of a material, such as invar, that is not greatly thermally expanded. In addition, the frame 12 resists deflection and high temperatures, because it has a relatively large thickness, for example, ranging from about 25 mm or more and 50 mm or less, as opposed to a thin film such as the resin film or the metal support layer. Therefore, the deflection mainly occurs in portions of the resin film and the metal support layer (metal layer 13). The deposition mask 1 is bowed down in a curved shape, namely, in a substantially arc shape. If the substrate 2 for vapor deposition is used in an organic EL display apparatus, it is made of a glass substrate or a flexible substrate made of a resin film, for example. If glass is used, the substrate 2 for vapor deposition is less likely to be deformed spot like, and likely to be bowed down in a curved shape even when pressed at a single point. Thus, when the upper surface of the substrate 2 for vapor deposition is pressed at a position immediately above the center of the deflection of the deposition mask 1, the substrate 2 for vapor deposition can be overlaid easily on the deposition mask 1 being bowed down. To determine the depth of the deflection, as described above, an actual length of (the curved surface of) the deposition mask 1 is approximately expressed by a length of the hypotenuse of a right triangle. Moreover since the substrate 2 for vapor deposition has a similar shape, its error is very small. If the substrate 2 for vapor deposition is a flexible substrate, when a shape of a pressed portion of the substrate 2 for vapor deposition is similar to an arc shape of the deposition mask 1, the substrate 2 for vapor deposition can be formed easily into a similar curved shape. Consequently, when the deposition mask 1 is bowed down at the fulcrum on its periphery due to its weight, the substrate 2 for vapor deposition can easily be brought into contact with the deposition mask 1 with the contact surfaces formed into the same curved shape by pressing the substrate 2 for vapor deposition, by an amount corresponding to the amount of deflection d0 of the deposition mask 1 as described in FIG. 2A, at a position that is vertical at the center of the deflection of the deposition mask 1 and that is on the upper surface of the substrate 2 for vapor deposition as illustrated in FIG. 1A.

The vapor deposition source 5 may be any given vapor deposition source having a point, line, or plane shape. For example, the vapor deposition source 5 of the linear type (extends in a direction perpendicular to the page of FIG. 1A) in which crucibles are arrayed, so called a linear source, is moved from the left edge to right edge of the page. The entire surface of the substrate 2 for vapor deposition is thereby deposited. As described above, the vapor deposition source 5 emits the vapor deposition material as an emitted beam. A cross section of this emitted beam has a fan shape defined by a shape of the crucibles, and both sides of the cross section have a certain angle. To deliver, at a predetermined site of the substrate 2 for vapor deposition, particles of the vapor deposition material in the vapor deposition beam even near its edge which has the fan-shape cross section without being blocked by the deposition mask 1, area of the deposition mask 1 near the opening portion are each formed into a tapered shape. Alternatively, however, the openings 12a in the metal support layer 12 may also have a large, non-tapered shape.

Next, a method for manufacturing an organic EL display apparatus using the vapor deposition method of the present invention will be described. Any processes in the manufacturing method other than the vapor deposition method can be performed by the well-known methods. Thus, a method for depositing organic layers by the vapor deposition method of the present invention will be mainly described with reference to FIGS. 5A and 5B.

The method for manufacturing an organic EL display apparatus of the present invention includes: forming a device substrate 21 by forming TFTs (not illustrated), a planarizing layer, and first electrodes (for example, anodes)

22 on a support substrate (not illustrated); overlaying and aligning the deposition mask 1 manufactured with the above method on the device substrate 21; and forming a deposition layer 25 of organic layers by depositing the organic material 51. Then, a second electrode 26 (cathode) is formed on the deposition layer 25.

Figure 5A:
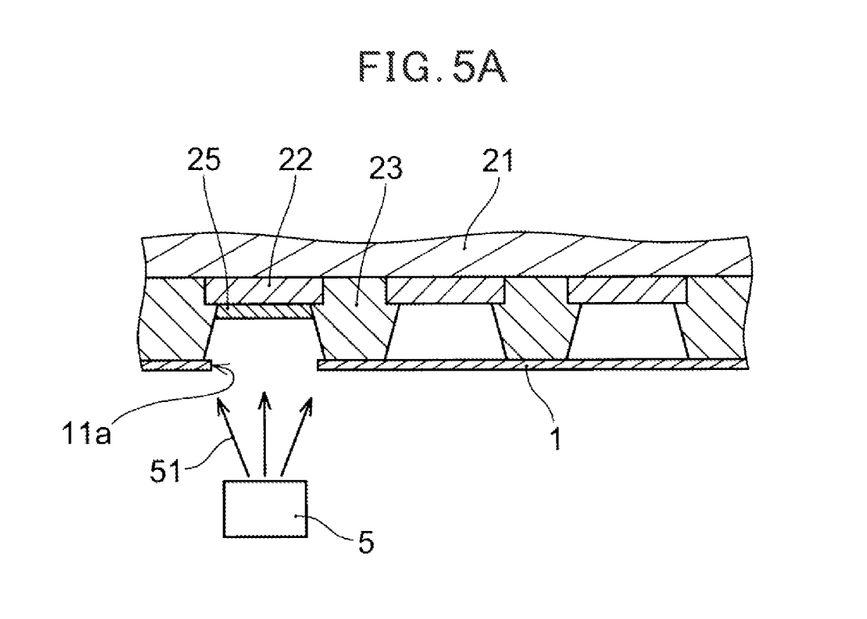
FIG. 5A is an explanatory diagram illustrating a vapor deposition process in a method for manufacturing an organic EL display apparatus of the present invention.
Figure 5B:
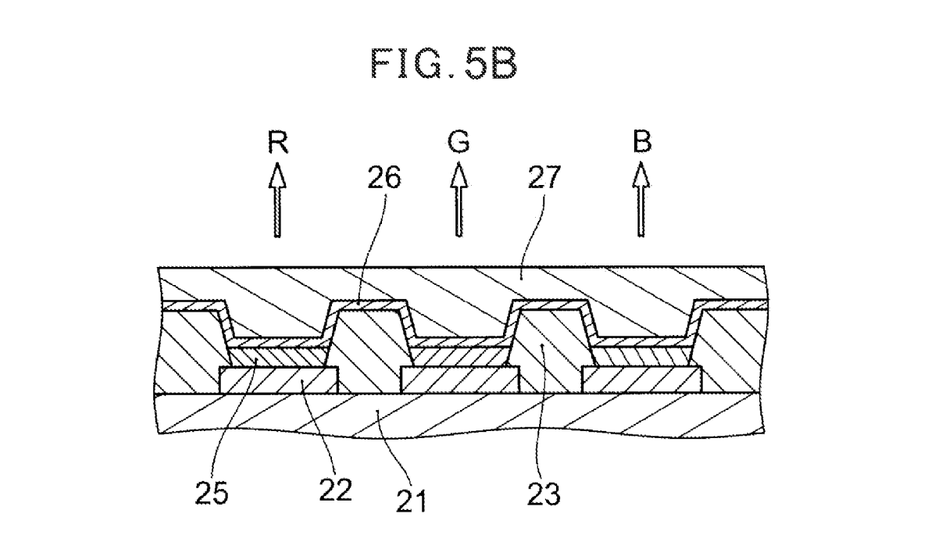
FIG. 5B is an explanatory diagram illustrating a process in which organic layers are deposited with the method for manufacturing the organic EL display apparatus of the present invention.

The device substrate 21 is formed by a process described below. For example, although not illustrated, switching elements, such as TFTs, are formed on a support substrate, such as a glass plate, in units of RGB sub-pixels in each pixel, and the first electrodes 22 connected to the switching elements are formed, on the planarizing layer, by a combination of a metal layer made of Ag or APC or the like, for example, and an ITO layer. As illustrated in FIGS. 5A and 5B, insulating bank 23 made of $SiO_2$, an acrylic resin, a polyimide resin, for example, are formed between the sub-pixels to divide the sub-pixels from each other. The above-mentioned deposition mask 1 is aligned with and fixed on the insulating banks 23 on the device substrate 21. As described above, the fixing is typically performed, for example, by using electromagnet 3, which is provided over the surface opposite to the vapor deposition surface of the device substrate 21, to attract the deposition mask 1. In the present invention, however, it is unnecessary to attract the deposition mask 1, in other words, to use a so-called a magnetic chuck. Since the touch play 41 presses the device substrate 21, the device substrate 21 brings into contact with the deposition mask 1 and the insulating banks 23 in the device substrate 21 is fixed with the deposition mask 1.

In the above state, as illustrated in FIG. 5A, the organic material 51 is evaporated from the vapor deposition source (crucibles) 5 in the vapor deposition apparatus, and then the organic material 51 is deposited only on parts of the device substrate 21 corresponding to parts of the deposition mask 1 in which the opening portions 11a are formed, so that the deposition layer 25 of the organic layers is formed on the first electrodes 22 in desired sub-pixels. Since the opening portion 11a in the deposition mask 1 is formed such that the diameter is shorter than the gap between opposed walls each other of the insulating banks 23, as described above, the organic material 51 is less likely to be deposited on the side wall of the insulating banks 23. As a result, as illustrated in FIGS. 5A and 5B, the deposition layer 25 of the organic layers is basically deposited only on the first electrodes 22. This vapor deposition step may be performed on each sub-pixel by sequentially replacing one deposition mask 1 with another. A deposition mask may be used to deposit the same material on a plurality of sub-pixels at the same time. According to the present invention, the deposited layer 25 of the organic layers can be formed with great precision, because the deposition mask 1 is in contact with the insulating banks 23 on the device substrate 21.

FIGS. 5A and 5B each simply illustrate the deposition layer 25 of the organic layers by a single layer, but in fact the deposition layer 25 of the organic layers may be formed of the deposition layers 25 of a plurality of layers made of different materials. For example, a hole injection layer is provided as a layer in contact with the anode 22 in some cases. The hole injection layer improves a hole injection property and is made of material having a good ionization energy matching. A hole transport layer is formed of, for example, an amine-based material on the hole injection layer. The hole transport layer improves stable transportability of holes and enables confinement of electrons (energy barrier) into a light emitting layer. Further, the light emitting layer, which is selected depending on a target emission wavelength, is formed on the hole transport layer, for example, by doping red or green organic phosphor material into Alq3, for the red or green wavelength. As a blue-type material, a bis(styryl)amine (DSA)-based organic material is used. An electron transport layer is formed of $Alq_3$, for example, on the light emitting layer. The electron transport layer improves an electron injection property and stably transports electrons. These respective layers, each having a thickness of approximately several tens of nanometers, are deposited to form the deposition layer 25 of the organic layers. It should be noted that an electron injection layer, such as LiF or Liq, which improves the electron injection property, may also be provided between the organic layers and the metal electrode.

In the deposition layer 25 of the organic layers, an organic layer of a material corresponding to each color of RGB is deposited as the light emitting layer. In addition, the hole transport layer, the electron transport layer, and other similar layers are preferably deposited separately by using materials suitable for the light emitting layer, if emphasis is placed on light emission performance. However, in consideration of the material cost, the same material common to two or three colors of RGB may be deposited in some cases. In a case where the material common to sub-pixels of two or more colors is deposited, the deposition mask 1 is formed to have opening portions 11a formed in the sub-pixels sharing the common material. In a case where individual sub-pixels have different deposited layers, for example, one deposition mask 1 is used for sub-pixels of R, so that the respective organic layers can be sequentially deposited. In a case where an organic layer common to RGB is deposited, other organic layers for the respective sub-pixels are deposited up to the lower side of the common layer, and then at the stage of the common organic layer, the common organic layer is deposited across the entire pixels at one time using the deposition mask 1 with the opening portions 11a formed at RGB sites.

After finishing the formation of the deposition layer 25 of all the organic layers and the electron injection layer, such as a LiF layer, the deposition mask 1 is separated, and the second electrode (e.g., cathode) 26 is formed over the entire surface. An example illustrated in FIG. 5B is a top emission type, in which light is emitted from a surface opposite to the device substrate 21 illustrated in the figure. Thus, the second electrode 26 may be formed of a light-transmissive material, for example, a thin Mg—Ag eutectic layer. Alternatively, for example, Al may be used. It should be noted that in a bottom emission type which emits light through the device substrate 21, ITO or In3O4, for example, may be used for the first electrodes 22, and metals having low work functions, for example, Mg, K, Li, or Al may be used for the second electrode 26. A protective layer 27 made of, for example, Si3N4, is formed on a surface of the second electrode 26. It should be noted that the whole deposited layers are sealed with a sealing layer made of glass or a moisture-resistant resin film (not illustrated), for example, and is thus configured to prevent the deposition layer 25 of the organic layers from absorbing moisture. Alternatively, a structure can also be provided in which the organic layers may be made common or shared as much as possible, and a color filter may be provided on the surface side of the organic layers. The deposition mask 1 configured above is reusable.

REFERENCE SIGNS LIST

1 Deposition mask
2 Substrate for vapor deposition
3 Pressing device
5 Vapor deposition source 12 Frame
13 Metal layer
14 Active region
15 Mask holder
21 Device substrate
22 First electrode
23 Insulating bank
25 Deposition layer
26 Second electrode
27 Protective layer
29 Substrate holder
30 Pressing tool
31 Sphere
32 Spherical cap
32a Base section
33 Spherical cap with projection
33a Base section
33b Surface of spherical cap
33c Projection
41 Touch plate
42 Support frame

What is claimed is:

1. A vapor deposition apparatus comprising:
a mask holder;
a deposition mask mounted on the mask holder, the deposition mask comprising a plurality of active regions in each of which a pattern of opening portions is to be formed;
a substrate holder configured to hold a substrate for vapor deposition, the substrate for vapor deposition being on a side of the deposition mask;
a touch plate provided on a side of the substrate for vapor deposition away from the deposition mask, the touch plate being in contact with a periphery of the substrate for vapor deposition;
a vapor deposition source configured to evaporate or sublimate a vapor deposition material, the vapor deposition source being provided on a side of the deposition mask away from the substrate for vapor deposition; and
a pressing device configured to press an upper surface of the substrate for vapor deposition;
wherein the vapor deposition apparatus further comprises a pressing tool between the touch plate and the substrate for vapor deposition; the pressing tool is configured to being pressed against the substrate for vapor deposition;
the pressing tool is a sphere.

2. The vapor deposition apparatus of claim 1, wherein the pressing device is provided so as to be able to press vertically the substrate for vapor deposition at a center position of deflection of the deposition mask on the upper surface of the substrate for vapor deposition.

3. The vapor deposition apparatus of claim 2, wherein the pressing device is formed so as to press the upper surface of the substrate for vapor deposition along a vertical line at the center of the deflection of the deposition mask with a fulcrum on a periphery of the deposition mask, and so as to make a pressed amount equate to or exceed a depth of the deflection of the deposition mask relative to the fulcrum on the periphery of the deposition mask.

4. The vapor deposition apparatus of claim 3, wherein the pressed amount equating to or exceeding the depth of the deflection of the deposition mask is a pressed amount that causes a length of an arc between the fulcrum on the periphery of the deposition mask and the center of the deflection of the deposition mask to substantially equates to a length of an arc of the substrate for vapor deposition between a point on a side of the deposition mask at which the substrate for vapor deposition is in contact with the fulcrum and a point on the side of the deposition mask at which the substrate for vapor deposition intersects the vertical line at the center of the deflection.

5. The vapor deposition apparatus of claim 4, wherein a length of an arc of the deposition mask is defined as a value or more obtained by adding variations in lengths of arcs of the active regions being bowed down to the length of the arc of the deposition mask bowed down at the fulcrum on the periphery.

6. A vapor deposition apparatus comprising:
a mask holder on which a deposition mask is mounted;
a substrate holder provided so as to be able to hold a substrate for vapor deposition;
a touch plate provided above the substrate for vapor deposition held by the substrate holder, the touch plate being in contact with a periphery of the substrate for vapor deposition;
a vapor deposition source that evaporates or sublimates a vapor deposition material, the vapor deposition source being provided on an opposite side of the deposition mask to the substrate holder; and
a pressing device that presses an upper surface of the substrate for vapor deposition,
wherein the pressing device is provided so as to be able to press vertically the substrate for vapor deposition at a center position of deflection of the deposition mask on the upper surface of the substrate for vapor deposition,
wherein the deposition mask has a plurality of active regions in each of which a pattern of opening portions is to be formed, and
wherein the pressing device is formed so as to press each of the active regions, by predetermined amounts or more, along vertical lines at centers of deflection of the respective active regions;
wherein the vapor deposition apparatus further comprises a pressing tool between the touch plate and the substrate for vapor deposition; the pressing tool is configured to being pressed against the substrate for vapor deposition;
the pressing tool is a spherical cap with a projection.

7. The vapor deposition apparatus of claim 6, wherein a predetermined amount is pressed with amount of $d_3(x)=(h_0+d_x)$ at each of the active regions, wherein each of the pressed amount $d_3(x)$ is equivalent to a sum of deflection $h_0$ of a corresponding active region and deflection $d_x$ of the deposition mask at the fulcrum on the periphery.

8. The vapor deposition apparatus of claim 7, wherein the deflection $d_x$ is calculated proportionally in accordance with a distance x between a position of the corresponding active region and the periphery of the deposition mask.

* * * * *